US007230495B2

(12) United States Patent
Lee et al.

(10) Patent No.: US 7,230,495 B2
(45) Date of Patent: Jun. 12, 2007

(54) PHASE-LOCKED LOOP CIRCUITS WITH REDUCED LOCK TIME

(75) Inventors: Seong-hoon Lee, Boise, ID (US); Feng Lin, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 10/834,775

(22) Filed: Apr. 28, 2004

(65) Prior Publication Data
US 2005/0242888 A1   Nov. 3, 2005

(51) Int. Cl.
*H03L 7/00* (2006.01)
(52) U.S. Cl. .......................................... 331/16; 327/147
(58) Field of Classification Search ................. 331/16, 331/17, 18, 25, DIG. 2; 327/147, 149, 153, 327/158, 161; 375/373–376
See application file for complete search history.

(56) References Cited

U.S. PATENT DOCUMENTS

| 3,473,160 | A | 10/1969 | Wahlstrom | 326/41 |
|---|---|---|---|---|
| 4,494,021 | A | 1/1985 | Bell et al. | 327/262 |
| 4,633,488 | A | 12/1986 | Shaw | 375/374 |
| 4,719,593 | A | 1/1988 | Threewitt et al. | 713/500 |
| 4,857,866 | A | 8/1989 | Tateishi | 331/10 |
| 4,868,522 | A | 9/1989 | Popat et al. | 731/2 |
| 4,959,646 | A | 9/1990 | Podkowa et al. | 326/95 |
| 5,072,195 | A | 12/1991 | Graham et al. | 331/2 |
| 5,075,575 | A | 12/1991 | Shizukuishi et al. | 326/39 |
| 5,079,519 | A | 1/1992 | Ashby et al. | 331/14 |
| 5,121,014 | A | 6/1992 | Huang | 327/277 |
| 5,133,064 | A | 7/1992 | Hotta et al. | 327/156 |
| 5,204,555 | A | 4/1993 | Graham et al. | 326/39 |
| 5,208,557 | A | 5/1993 | Kersh | 331/57 |

(Continued)

FOREIGN PATENT DOCUMENTS

EP    0 266 065    5/1988

(Continued)

OTHER PUBLICATIONS

U.S. Appl. No. 10/138,600, filed May 3, 2002, Starr et al.

(Continued)

*Primary Examiner*—Linh My Nguyen
(74) *Attorney, Agent, or Firm*—Fish & Neave IP Group Ropes & Gray LLP; Jeffrey H. Ingerman; Chia-Hao La

(57) ABSTRACT

PLL circuits are provided in which a voltage-controlled oscillator (VCO) comprising one or more voltage-controlled delay units (VCDs) is initialized with the control voltage of a voltage-controlled delay line (VCDL) having substantially identical VCDs. In general, VCDLs provide for faster signal locking than do VCOs. The VCO locks to a frequency of a reference signal at substantially the same time that the VCDL locks to the reference signal. Lock time of the PLL circuit is thereby reduced. A timing circuit prevents the VCO control voltage from being adjusted during phase locking of the VCO. This allows the VCO frequency lock to be maintained during the VCO phase locking. Lock time is thereby further reduced. The timing circuit locks the VCO to a phase of the reference signal by restarting oscillation of the VCO at an appropriate time.

22 Claims, 5 Drawing Sheets

U.S. PATENT DOCUMENTS

| | | | | |
|---|---|---|---|---|
| 5,239,213 | A | 8/1993 | Norman et al. | 326/41 |
| 5,349,544 | A | 9/1994 | Wright et al. | 364/600 |
| 5,394,116 | A | 2/1995 | Kasturia | 331/34 |
| 5,397,943 | A | 3/1995 | West et al. | 326/39 |
| 5,418,499 | A | 5/1995 | Nakao | 331/57 |
| 5,420,544 | A | 5/1995 | Ishibashi | 331/11 |
| 5,424,687 | A | 6/1995 | Fukuda | 331/11 |
| 5,448,191 | A | 9/1995 | Meyer | 327/105 |
| 5,477,182 | A | 12/1995 | Huizer | 327/261 |
| 5,506,878 | A | 4/1996 | Chiang | 377/39 |
| 5,542,083 | A | 7/1996 | Hotta et al. | 395/550 |
| 5,581,214 | A | 12/1996 | Iga | 331/16 |
| 5,629,651 | A | 5/1997 | Mizuno | 331/34 |
| 5,642,082 | A | 6/1997 | Jefferson | 331/25 |
| 5,646,564 | A | 7/1997 | Erickson et al. | 327/158 |
| 5,656,959 | A | 8/1997 | Chang et al. | 327/105 |
| 5,691,669 | A | 11/1997 | Tsai et al. | 331/17 |
| 5,699,020 | A | 12/1997 | Jefferson | 331/17 |
| 5,742,180 | A | 4/1998 | DeHon et al. | 326/40 |
| 5,744,991 | A | 4/1998 | Jefferson et al. | 327/158 |
| RE35,797 | E | 5/1998 | Graham et al. | 326/40 |
| 5,777,360 | A | 7/1998 | Rostoker et al. | 257/315 |
| 5,815,016 | A | 9/1998 | Erickson | 327/158 |
| 5,847,617 | A | 12/1998 | Reddy et al. | 331/157 |
| 5,889,436 | A | 3/1999 | Yeung et al. | 331/2 |
| 5,900,757 | A | 5/1999 | Aggarwal et al. | 327/198 |
| 5,952,891 | A | 9/1999 | Boudry | 331/57 |
| 5,963,069 | A | 10/1999 | Jefferson et al. | 327/158 |
| 5,970,110 | A | 10/1999 | Li | 377/48 |
| 5,974,105 | A | 10/1999 | Wang et al. | 375/376 |
| 5,987,543 | A | 11/1999 | Smith | 710/70 |
| 5,999,025 | A | 12/1999 | New | 327/156 |
| 6,014,048 | A | 1/2000 | Talaga, Jr. et al. | 327/292 |
| 6,043,677 | A | 3/2000 | Albu et al. | 326/37 |
| 6,069,506 | A | 5/2000 | Miller, Jr. et al. | 327/158 |
| 6,069,507 | A | 5/2000 | Shen et al. | 327/155 |
| 6,104,222 | A | 8/2000 | Embree | 327/154 |
| 6,114,915 | A | 9/2000 | Huang et al. | 331/25 |
| 6,141,394 | A | 10/2000 | Linebarger et al. | 327/157 |
| 6,144,242 | A | 11/2000 | Jeong et al. | 327/270 |
| 6,157,266 | A | 12/2000 | Tsai et al. | 327/280 |
| 6,249,189 | B1 | 6/2001 | Wu et al. | 331/18 |
| 6,252,419 | B1 | 6/2001 | Sung et al. | 326/38 |
| 6,259,293 | B1* | 7/2001 | Hayase et al. | 327/276 |
| 6,275,084 | B1* | 8/2001 | McAdams | 327/239 |
| 6,278,332 | B1 | 8/2001 | Nelson et al. | 331/17 |
| 6,320,469 | B1 | 11/2001 | Friedberg et al. | 327/156 |
| 6,323,705 | B1* | 11/2001 | Shieh et al. | 327/158 |
| 6,333,896 | B1 | 12/2001 | Lee | 327/158 |
| 6,342,797 | B1 | 1/2002 | Lee | 327/263 |
| 6,369,624 | B1 | 4/2002 | Wang et al. | 327/147 |
| 6,373,278 | B1 | 4/2002 | Sung et al. | 326/39 |
| 6,411,150 | B1 | 6/2002 | Williams | 327/112 |
| 6,414,528 | B1* | 7/2002 | Usui | 327/158 |
| 6,434,062 | B2 | 8/2002 | Lee | 365/236 |
| 6,437,618 | B2 | 8/2002 | Lee | 327/158 |
| 6,462,623 | B1 | 10/2002 | Horan | 331/17 |
| 6,476,652 | B1 | 11/2002 | Lee | 327/158 |
| 6,483,359 | B2 | 11/2002 | Lee | 327/149 |
| 6,483,886 | B1 | 11/2002 | Sung et al. | 327/157 |
| 6,573,771 | B2 | 6/2003 | Lee et al. | 327/149 |
| 6,642,758 | B1 | 11/2003 | Wang et al. | 327/156 |
| 6,768,690 | B2 | 7/2004 | Kwon et al. | 365/194 |
| 6,853,226 | B2 | 2/2005 | Kwak et al. | 327/159 |
| 6,914,798 | B2 | 7/2005 | Kwon et al. | 365/145 |
| 2001/0022745 | A1 | 9/2001 | Lee | 365/194 |
| 2001/0033188 | A1 | 10/2001 | Aung et al. | 327/141 |
| 2002/0000855 | A1 | 1/2002 | Lee | 327/277 |
| 2002/0015338 | A1 | 2/2002 | Lee | 365/200 |
| 2003/0001635 | A1 | 1/2003 | Lee et al. | 327/158 |
| 2003/0002357 | A1 | 1/2003 | Kwon et al. | 365/194 |
| 2003/0030473 | A1 | 2/2003 | Lee | 327/158 |
| 2003/0210602 | A1 | 11/2003 | Lee | 365/233 |
| 2004/0085107 | A1 | 5/2004 | Kwak et al. | 327/159 |
| 2004/0201406 | A1 | 10/2004 | Lee et al. | 327/158 |
| 2004/0217789 | A1 | 11/2004 | Kwak et al. | 327/158 |
| 2004/0233700 | A1 | 11/2004 | Kwon et al. | 365/145 |
| 2004/0268016 | A1 | 12/2004 | Lee et al. | 711/1 |
| 2005/0110539 | A1 | 5/2005 | Lee | 327/158 |
| 2005/0110554 | A1 | 5/2005 | Lee | 327/158 |
| 2005/0127964 | A1 | 6/2005 | Lee | 327/158 |
| 2005/0127965 | A1 | 6/2005 | Lee | 327/158 |
| 2005/0134337 | A1 | 6/2005 | Lee | 327/158 |

FOREIGN PATENT DOCUMENTS

| | | |
|---|---|---|
| EP | 0 416 930 | 3/1991 |
| EP | 0 778 517 | 6/1997 |
| EP | 0 987 822 | 3/2000 |
| EP | 1 056 207 | 11/2000 |
| JP | 1-137646 | 5/1989 |
| JP | 10-215156 | 8/1998 |

OTHER PUBLICATIONS

Advanced Micro Devices, Inc., "Am2971 Programmable Event Generator (PEG)," Publication No. 05280, Rev. C, Amendment /0, pp. 4-286-4-303 (Jul. 1986).

Advanced Micro Devices, Inc., "AmPAL*23S8 20-Pin IMOX PAL-Based Sequencer," Publication No. 06207, Rev. B, Amendment /0, pp. 4-102-4-121 (Oct. 1986).

Agere Systems, Inc., "ORCA ORT82G5 0.622/1.0-1.25/2.0-2.5/3. 125 Gbits/s Backplane Interface FPSC," Preliminary Data Sheet, pp. 1-35 (Jul. 2001).

Agere Systems, Inc., "ORCA ORT8850 Field-Programmable System Chip (FPSC) Eight Channel x 850 Mbits/s Backplane Transceiver," Product Brief, pp. 1-6 (Jul. 2001).

Agere Systems, Inc., "ORCA ORT8850 Field-Programmable System Chip (FPSC) Eight Channel x 850 Mbits/s Backplane Transceiver," Product Brief, pp. 1-36 (Aug. 2001).

DynaChip Corp., "Application Note: Using Phase Locked Loops in DL6035 Devices" (1998).

DynaChip Corp., DY600 Family Datasheet (Dec. 1998).

Ko, U., et al., "A 30-ps Jitter, 3.6s Locking, 3.3-Volt Digital PLL for CMOS Gate Arrays," *Proceedings of the IEEE 1993 Custom Integrated Circuits Conference*, Publication No. 0-7803-0826-3/93, pp. 23.3.1-23.3.4 (May 9-12, 1993).

LSI Logic Corp., *500K Technology Design Manual* (Document DB04-000062-00, First Edition), pp. 8-1-8-33 (Dec. 1996).

Lucent Technologies, Inc., "Optimized Reconfigurable Cell Array (ORCA®) OR3Cxxx/OR3Txxx Series Field-Programmable Gate Arrays," Preliminary Product Brief, (Nov. 1997).

Lucent Technologies, Inc., "ORCA® Series 3 Field-Programmable Gate Arrays," Preliminary Data Sheet, Rev. 01 (Aug. 1998).

Monolithic Memories, Inc., "Programmable Array Logice PAL20RA10-20 Advance Information," pp. 5-95-5-102 (Jan. 1998).

National Semiconductor Corp., *LVDS Owner's Manual & Design Guide* (Apr. 25, 1997).

National Semiconductor Corp., "DS90CR285/DS90CR286 +3.3V Rising Edge Data Strobe LVDS 28-Bit Channel Link-66 MHZ," (Mar. 1998).

Xilinx, Inc., "Virtex 2.5V Field Programmable Gate Arrays Advance Product Specification (Version 1.0)" (Oct. 20, 1998).

Xilinx, Inc., "Application Note: Using the Virtex Delay-Locked Loop (Version 1.31)" (Oct. 21, 1998).

Zaks, R., et al., *From Chips to Systems: An Introduction to Microcomputers*, pp. 54-61 (Prentice-Hall, Inc., Englewood Cliffs, NJ, 1987).

* cited by examiner

PHASE-LOCKED LOOP CIRCUITS WITH REDUCED LOCK TIME

BACKGROUND OF THE INVENTION

This invention relates to phase-locked loop (PLL) circuits. More particularly, this invention relates to PLL circuits with reduced lock time.

Generally speaking, PLL circuits generate and output one or more signals locked to both the phase and frequency of an input signal. PLL circuits are widely used in many applications. For example, in one application, PLL circuits are used as multi-phase clock generators that output a plurality of clock signals phase-shifted in equally-spaced increments relative to the input clock signal. PLL multi-phase clock generators are useful in electronic systems having complex timing requirements in which multi-function operations are completed during a single input clock cycle or in which an operation extends over more than one input clock cycle. In another application, PLL circuits are used as frequency multipliers that output a clock signal having a higher frequency than the frequency of the input clock signal.

Conventional PLL circuits have characteristically slow lock times. Lock time is the time required to lock an output signal to both the phase and frequency of an input signal. In particular, conventional PLL circuits must determine both the phase and frequency of an input signal in order to generate a locked output signal. This causes conventional PLL circuits to have increased lock time relative to other clock synchronization circuits (e.g., delay-locked loop (DLL) circuits) that need only determine the phase of the input signal in order to generate a locked output signal. The slow lock times of conventional PLL circuits are also attributable to the inability of conventional PLL circuits to adjust the phase of an output signal without simultaneously adjusting the frequency of the output signal. Nevertheless, PLL circuits have various advantages over other clock synchronization circuits (e.g., PLL circuits generally require smaller delay lines for locking to an input signal than do DLL circuits).

In view of the foregoing, it would be desirable to provide phase-locked loop circuits with reduced lock time.

SUMMARY OF THE INVENTION

It is an object of this invention to provide phase-locked loop (PLL) circuits with reduced lock time.

In accordance with this invention, a PLL circuit is provided in which a voltage-controlled oscillator (VCO) comprising one or more voltage-controlled delay units (VCDs) is initialized with the control voltage of a voltage-controlled delay line (VCDL) having substantially identical VCDs (i.e., VCDs having the same delay versus control voltage characteristics as the VCDs of the VCO). In general, VCDLs provide for faster signal locking than do VCOs. The VCO locks to a frequency of a reference signal at substantially the same time that the VCDL locks to the reference signal. Lock time of the PLL circuit is thereby reduced. A timing circuit prevents the VCO control voltage from being adjusted during phase locking of the VCO. This allows the VCO frequency lock to be maintained during the VCO phase locking. Lock time of the PLL circuit is thereby further reduced. The timing circuit locks the VCO to a phase of the reference signal by restarting oscillation of the VCO at an appropriate time.

The invention also provides methods of reducing lock time of PLL circuits.

BRIEF DESCRIPTION OF THE DRAWINGS

The above and other objects and advantages of the invention will be apparent upon consideration of the following detailed description, taken in conjunction with the accompanying drawings, in which like reference characters refer to like parts throughout, and in which.

DETAILED DESCRIPTION OF THE INVENTION

The invention is directed to reducing lock time of phase-locked loop (PLL) circuits.

Figure 1:
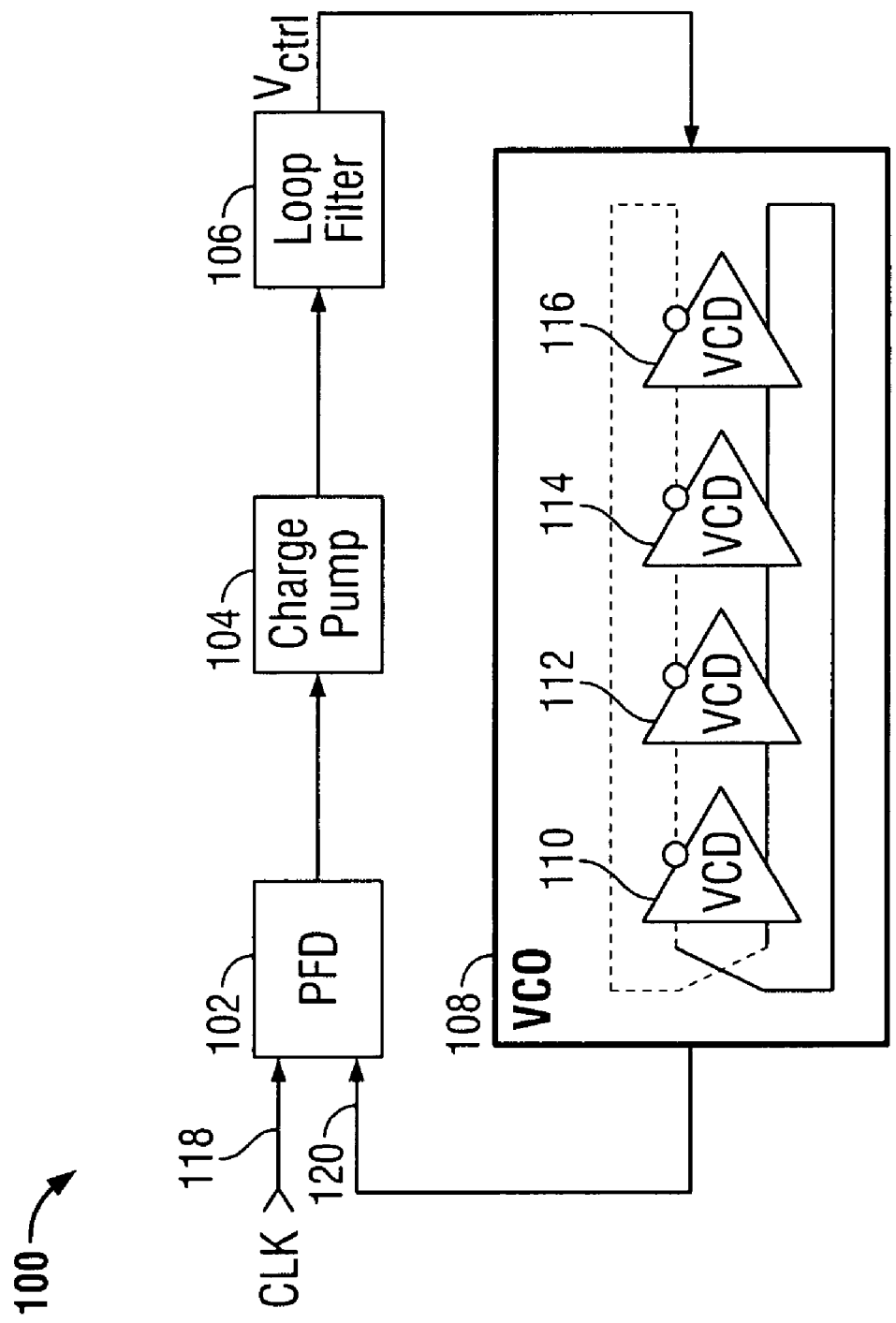
FIG. 1 is a block diagram of a known phase-locked loop circuit.

FIG. 1 shows a known PLL circuit 100. PLL circuit 100 includes phase/frequency detector 102, charge pump 104, loop filter 106 and voltage-controlled oscillator (VCO) 108. VCO 108 includes a plurality of serially-coupled voltage-controlled delay units (VCDs) 110, 112, 114 and 116 that generate an internal clock signal. As shown in FIG. 1, the inverted and noninverted outputs of VCD 116 (i.e., the last VCD in the serially-coupled chain) are respectively coupled to the noninverted and inverted inputs of VCD 110 (i.e., the first VCD in the serially-coupled chain).

PLL circuit 100 locks to the phase and frequency of a reference clock signal as follows: Phase/frequency detector 102 receives the reference signal and a signal output from VCD 116 (i.e., the last VCD in the serially-coupled chain) at inputs 118 and 120, respectively. Phase/frequency detector 102 compares the phases and frequencies of input signals 118 and 120, and outputs a signal indicating the results of this comparison to charge pump 104. The desired phase relationship between input signals 118 and 120 is often that signals 118 and 120 are in-phase (i.e., zero phase-shift). The desired frequency difference between input signals 118 and 120 is often 0 hertz. Charge pump 104 adjusts the control voltage ($V_{ctrl}$) supplied to VCDs 110, 112, 114 and 116 as necessary to produce the desired phase and frequency relationships. This causes PLL circuit 100 to have a characteristically slow lock time. In particular, lock time of PLL circuit 100 is slow in comparison to the lock time of other clock synchronization circuits (e.g., delay-locked loop (DLL) circuits comprising voltage-controlled delay lines) that need only phase-adjust their output signals in order to lock to the reference signal. The slow lock time of PLL circuit 100 is also attributable to the inability of PLL circuit 100 to change the phase of signal 120 without simultaneously changing the frequency of signal 120. In particular, an adjustment of the control voltage during locking by PLL circuit 100 produces changes to both the phase and frequency of clock signal 120. PLL circuit 100 is locked once both the desired phase and frequency relationships between input signals 118 and 120 are produced. Phase/frequency detector 102, charge pump 104, loop filter 106 and VCO 108 operate in substantially the same way described above to maintain the locked condition of PLL circuit 100.

Figure 2:
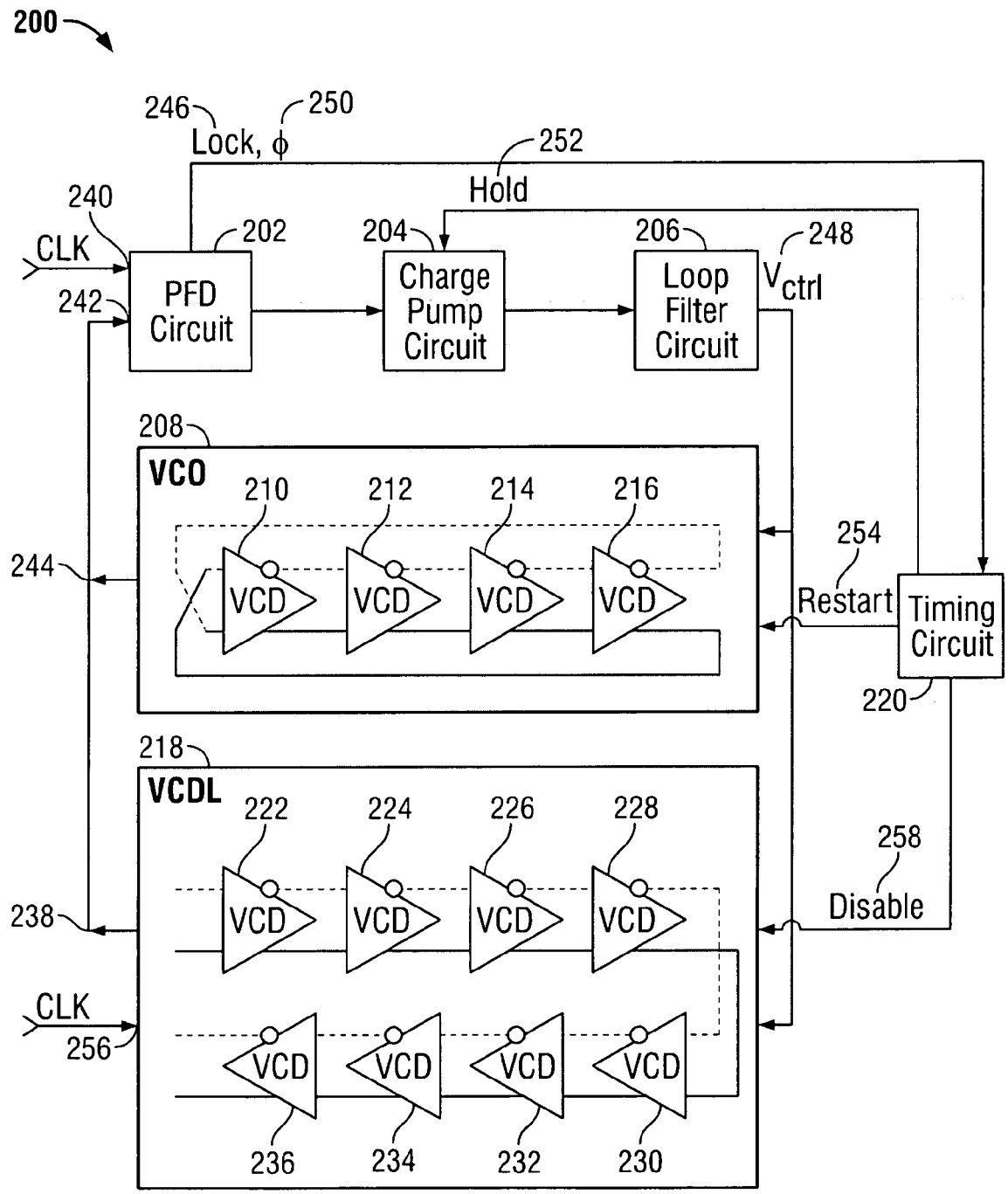
FIG. 2 is a block diagram of phase-locked loop circuit with reduced lock time in accordance with the present invention.

FIG. 2 shows a PLL circuit 200 in accordance with the present invention. PLL circuit 200 includes phase/frequency detecting circuit 202, charge pump circuit 204, loop filter circuit 206, VCO 208 including VCDs 210, 212, 214 and 216, voltage-controlled delay line (VCDL) 218 and timing circuit 220. VCDL 218 includes a plurality of serially-coupled VCDs 222, 224, 226, 228, 230, 232, 234 and 236. For reasons described below, VCDs 222–236 of VCDL 218 are preferably substantially identical to VCDs 210–216 of VCO 208. In particular, VCDs 210–216 and VCDs 222–236 preferably have the same delay versus control voltage ($V_{ctrl}$) characteristics, meaning that each of VCDs 210–216 and 222–236 preferably introduces the same amount of delay in response to receiving a given $V_{ctrl}$.

PLL circuit 200 locks VCO 208 to the frequency of the reference clock signal as follows: Phase/frequency detecting circuit 202 receives the reference signal and signal 238 output by VCDL 218 at inputs 240 and 242, respectively. Phase/frequency detecting circuit 202, charge pump circuit 204 and loop filter circuit 206 lock VCDL output signal 238 to the reference signal. Timing circuit 220 preferably prevents VCO output signal 244 from being received at input 242 of phase/frequency detecting circuit 202 during locking of VCDL output signal 238. Signal locking using VCDL 218 and preventing VCO output signal 244 from being received at input 242 during VCDL locking are described in greater detail below. Timing circuit 220 receives from phase/frequency detecting circuit 202 signal 246 indicating that VCDL output signal 238 is locked to the reference clock signal. The control voltage ($V_{ctrl}$) 248 used to produce the VCDL lock (i.e., the control voltage provided to VCDs 222–236) is provided to VCDs 210–216 of VCO 208. Provided that VCDs 210–216 are substantially identical to VCDs 222–236, the internal clock of VCO 208 substantially immediately begins to oscillate with a desired frequency ($f_{locked}$) locked to the frequency ($f_{ref}$) of the reference clock signal (e.g., $f_{locked}=f_{ref}/2$, $f_{locked}=f_{ref}$, $f_{locked}=2*f_{ref}$, etc.). Examples of PLL circuits having desired frequencies that are either higher, lower or equal to the reference frequency are described below.

PLL circuit 200 locks VCO 208 to the phase of the reference clock signal as follows: Timing circuit 220 preferably causes input 242 of phase/frequency detecting circuit 202 to discontinue receiving VCDL output signal 238, and to receive VCO output signal 244. Various ways for selectively providing output signals 238 and 244 to input 242 of phase/frequency detecting circuit 202 are described in greater detail below. Phase/frequency detecting circuit 202 compares the phases of the reference signal and VCO output signal 244, and outputs signal 250 indicating the results of this comparison to timing circuit 220. Timing circuit 220 generates signal 252 which prevents charge pump circuit 204 from adjusting $V_{ctrl}$ 248 during phase locking of the VCO internal clock signal. This causes the frequency of the VCO internal clock to be maintained at the desired frequency (f) during phase locking of the VCO internal clock. Based on signal 250, timing circuit 220 generates signal 254 that adjusts the phase of VCO output signal 244 by restarting oscillation of the VCO internal clock. Preferably, only one restart signal 254 is required to lock the VCO internal clock signal to the phase of the reference signal. However, multiple iterations of measuring a phase difference by phase/frequency detecting circuit 202 and restarting the VCO internal clock signal by timing circuit 220 may be provided in order to lock the phase of the VCO internal clock to the phase of the reference signal. VCO 208 of PLL circuit 200 is locked once a desired phase relationship is produced between the reference signal and VCO output signal 244. At about the time that VCO 208 locks, timing circuit 220 discontinues preventing charge pump circuit 204 from adjusting $V_{ctrl}$ 248. Phase/frequency detecting circuit 202, charge pump circuit 204, loop filter circuit 206 and VCO 208 maintain the locked condition of PLL circuit 200. Operation of PLL circuit 200 to maintain the locked condition may be similar to operation of PLL circuit 100 (FIG. 1).

Figure 3:
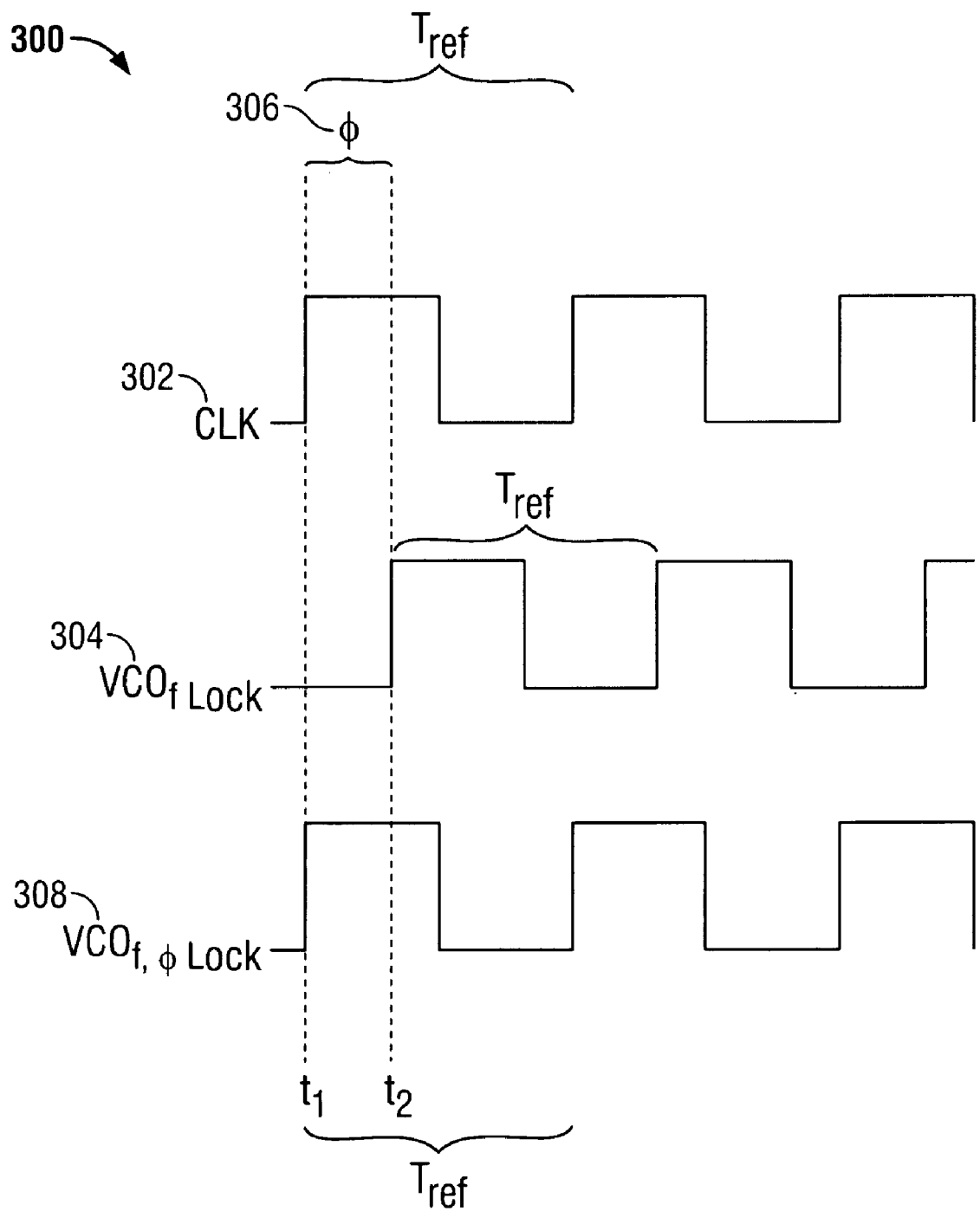
FIG. 3 is a timing diagram showing locking of the phase-locked loop circuit of FIG. 2 to a reference clock signal in accordance with the present invention.

FIG. 3 is a timing diagram 300 that shows locking of VCO 208 (FIG. 2) to reference clock signal 302 in accordance with the present invention. Output signal 304 of VCO 208 is first locked to the frequency ($f_{ref}=1/T_{ref}$) of reference clock signal 302. This frequency lock is maintained during locking of the VCO output signal to the phase of reference signal 302 (i.e., changes to the phase of the VCO output signal during locking do not produce changes to the frequency of the VCO output signal). The phase difference ($\phi$) 306 between signals 302 and 304 can be expressed in degrees by the following equation:

$$\phi=((t_2-t_1)*360°)/T_{ref}$$

where $t_1$ and $t_2$ are times of corresponding signal positions of signals 302 and 304. In the example of FIG. 3, phase difference 306 is measured based on a time difference between the rising edges of signals 302 and 304. In other embodiments of the present invention, phase difference 306 may be measured based on the falling edges of signals 302 and 304 or by any other suitable approach. Based on a measurement of phase difference 306, oscillation of VCO 208 is restarted in order to produce VCO output signal 308 locked to the phase of reference signal 302.

In accordance with the present invention, lock time of PLL circuit 200 (FIG. 2) is advantageously reduced. In general, VCDLs provide for faster signal locking than do VCOs. This is because, unlike VCOs, VCDLs do not generate an internal clock signal (i.e., the outputs of VCD 236 are not cross-coupled to the inputs of VCD 222 and therefore VCDL 218 is not an oscillator). VCDLs instead receive the reference clock signal as input (i.e., VCDL 218 receives the reference clock at input 256). As a result, a VCDL output substantially always has the same frequency as the reference signal, and need only be phase adjusted in order to lock the VCDL to the reference signal. Therefore, causing VCO 208 to lock to the frequency of the reference signal at substantially the same time that VCDL 218 locks to the reference signal reduces lock time of PLL circuit 200. The locked frequency ($f_{locked}$) at which the internal clock of VCO 208 begins to oscillate at substantially the same time that VCDL 218 locks to the reference signal can be represented by the following equation:

$$f_{locked}=(N*f_{ref})/(2*M)$$

where N is the number of VCDs in VCDL 218, $f_{ref}$ is the reference clock frequency and M is the number of VCDs in VCO 208. As described above, this equation holds for the case in which VCO 208 and VCDL 218 have substantially identical VCDs. In addition, this equation is for the typical case in which VCDL output signal 238 is adjusted to be 360° out-of-phase with the reference signal. For example, referring to the embodiment of FIG. 2 in which VCDL 218 includes 8 VCDs (i.e., N=8) and VCO 208 includes 4 VCDs (i.e., M=4), the locked frequency ($f_{locked}$) at which VCO 208 substantially immediately begins to oscillate is $(8*f_{ref})/(2*4)$, or equivalently, $f_{ref}$. Other numbers of substantially identical VCDs may of course be provided to adjust the frequency at which VCD 208 begins to oscillate when the control voltage used to lock VCDL 218 to the reference signal is provided to VCO 208.

For example, $f_{locked}$ could be set equal to $2*f_{ref}$ by including sixteen VCDs in VCDL 218 (i.e., N=16) and four VCDs in VCO 208 (i.e., M=4). To allow phase/frequency detecting circuit 202 to detect the substantially immediate frequency lock of VCO 208 to the reference signal, a divide-by-2 frequency divider may be coupled between VCO output 244 and input 242 such that input 242 receives VCO output signal 244 frequency-divided by 2. In this example, VCDL output signal 238 is not frequency divided before being received by input 242. As another example, $f_{locked}$ could be set equal to $f_{ref}/2$ by including four VCDs in VCDL 218 (i.e., N=4) and four VCDs in VCO 208 (i.e., M=4). To allow phase/frequency detecting circuit 202 to detect the substantially immediate frequency lock of VCO 208, a multiplexer may be coupled to input 240 that causes input 240 to receive the reference signal during locking of VCDL 218, and to receive the reference signal frequency divided by 2 during locking of PLL 208.

Lock time of PLL circuit 200 is further reduced because PLL circuit 200 uses timing circuit 220, and not charge pump circuit 204, to adjust the phase of VCO output signal 244. In particular, as described above, known PLL circuit 100 (FIG. 1) cannot adjust the phase of a VCO output signal without simultaneously adjusting the frequency of the output signal. This contributes to the characteristically slow lock time of known PLL circuit 100. In contrast, timing circuit 220 of PLL circuit 200 (FIG. 2) prevents charge pump circuit 204 from adjusting control voltage 248 during phase locking of VCO output signal 244. Timing circuit 220 then adjusts the phase of VCO output signal 244 (i.e., by generating one or more restart signals 254) without affecting the frequency of signal 244.

In accordance with the present invention, VCO output signal 244 and VCDL output signal 238 may be selectively provided to input 242 of phase/frequency detecting circuit 202 using any suitable approach. In some embodiments of the present invention, outputs 238 and 244 are coupled directly to input 242 of a single phase/frequency detector 202. Therefore, preferably only one of output signals 238 and 244 is provided to input 242 at any given time. For example, when VCDL output 238 is active (i.e., when VCDL 218 outputs a signal), VCO 208 may be prevented from oscillating by holding one of the inverted and noninverted outputs of VCD 216 at a supply voltage and the other of the inverted and noninverted outputs at ground potential. This causes VCO output 244 to be inactive, and provides the advantage of reducing power consumption of PLL circuit 200. At an appropriate time (e.g., in response to receiving signal 246 indicating that VCDL output 238 is locked to the reference signal), timing circuit 220 may generate a signal (e.g., signal 254) that causes VCO 208 to begin oscillating and signal 258 which causes VCDL output 238 to be inactive. Signal 246 output by the phase/frequency detector 202 may then indicate an unlocked condition of VCO output signal 244. Signal 250 may indicate the phase difference between VCO output signal 244 and the reference signal. In another example, PLL circuit 200 may include a multiplexer having inputs coupled to outputs 238 and 244 and an output coupled to input 242 of the single phase/frequency detector 202. Timing circuit 220 may generate a signal that controls which of signals 238 and 244 is provided by the multiplexer to input 242 of phase/frequency detecting circuit 202. A combination of the above approaches or any other suitable approach for selectively providing signals 238 and 244 to phase/frequency detecting circuit 202 may be provided.

In some embodiments of the present invention, multiple installations of any or all of phase and/or frequency detecting circuitry, charge pump circuitry and loop filter circuitry may be provided. For example, phase/frequency detecting circuit 202, charge pump circuit 204 and loop filter circuit 206 may respectively include a first phase/frequency detector, charge pump and loop filter for use in connection with VCO 208. Phase/frequency detecting circuit 202, charge pump circuit 204 and loop filter circuit 206 may respectively include a separate phase detecting circuitry (e.g., a phase detector or a phase/frequency detector), charge pump and loop filter for use in connection with VCDL 218. VCDL 218 and the separate phase detecting circuitry, charge pump and loop filter may form a delay-locked loop (DLL) circuit. Timing circuit 220 may receive a first signal 246 from the first phase frequency detector indicating whether VCO output 244 is locked to the reference signal. A second signal 246 may be received from the separate phase detecting circuitry indicating whether VCDL output 238 is locked to the reference signal. VCO 208 may be initialized with the control voltage of VCDL 218 (i.e., the control voltage provided by the separate phase detecting circuitry, charge pump and loop filter) using any suitable approach. For example, the VCDL control voltage may be provided to VCO 208 through a switch (e.g., implemented as part of timing circuit 220). The switch may be closed during locking of VCDL output signal 238 to the reference signal. The switch may open after VCDL output signal 238 locks to the reference signal (e.g., once signal 246 from the separate phase detecting circuitry indicates that VCDL output signal 238 is locked). The control voltage for VCO 208 may then be provided by the first phase/frequency detector, charge pump and loop filter.

Figure 4:
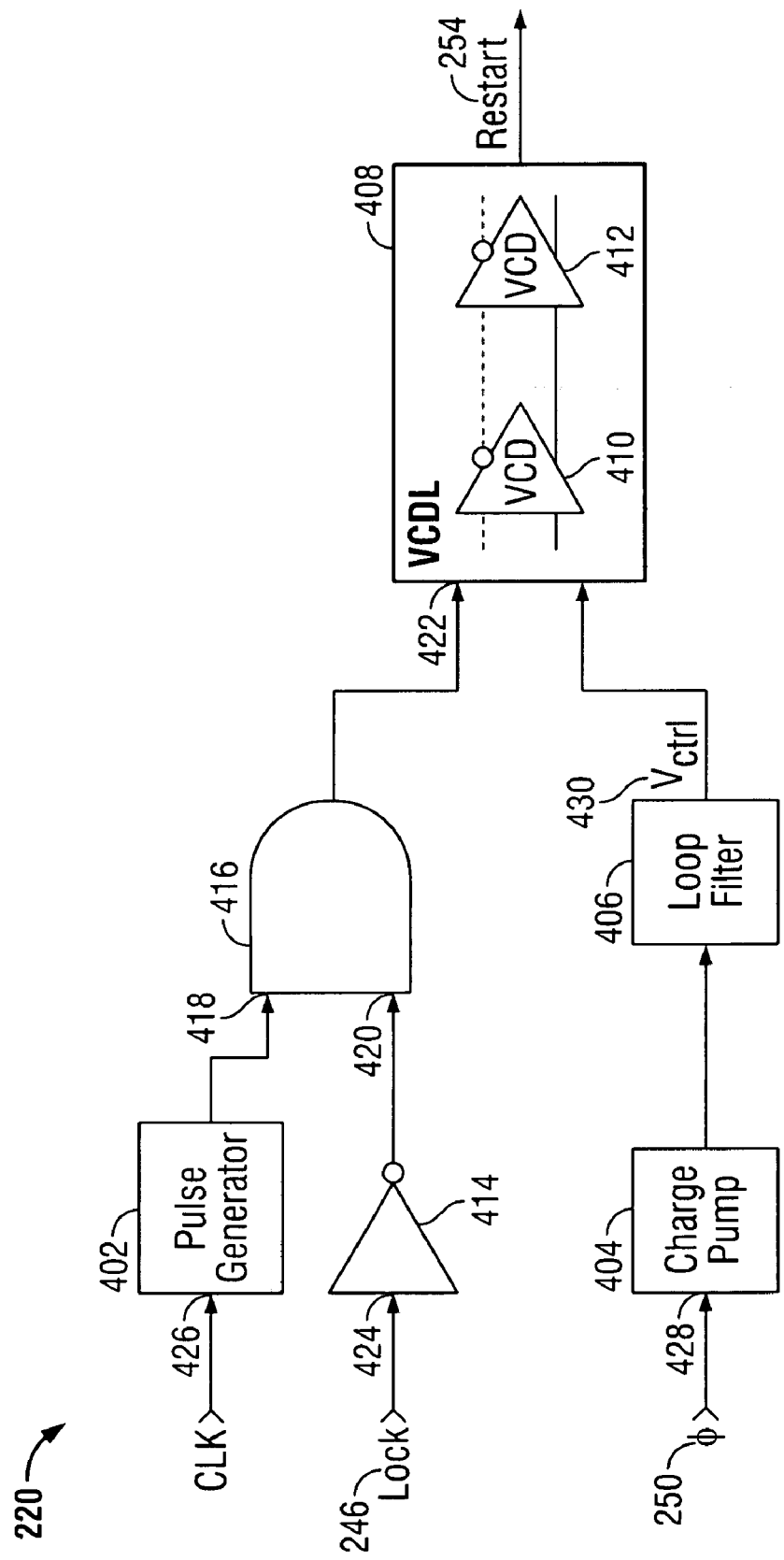
FIG. 4 is a circuit diagram showing various illustrative components of the timing circuit of the phase-locked loop circuit of FIG. 2 in accordance with the present invention.

In accordance with the present invention, timing circuit 220 may include any suitable number and configuration of analog components, digital components or a combination of analog and digital components that perform the functions of timing circuit 220 described in connection with PLL circuit 200. FIG. 4 shows various illustrative components of a timing circuit 220 (FIG. 2) in accordance with the present invention. Referring to FIGS. 2 and 4, timing circuit 220 may include pulse generator 402, charge pump 404, loop filter 406, VCDL 408 including VCDs 410 and 412, inverter 414 and AND gate 416. AND gate 416 receives the outputs of pulse generator 402 and inverter 414 at inputs 418 and 420, respectively. The output of AND gate 416 is received at input 422 of VCDL 408, and propagates through VCDs 410 and 412 in order to generate restart signal 254 (i.e., the signal used to adjust the phase of VCO output signal 244 by restarting oscillation of VCO 208). Inverter 414 receives at input 424 LOCK signal 246 indicating whether VCO output signal 244 received at input 242 of phase/frequency detector circuit 202 is locked to the reference signal. When LOCK signal 246 is a logic "0" (i.e., VCO output signal 244 is not locked to reference signal 240), AND gate 416 provides a pulse (e.g., 2 nanoseconds wide) generated by pulse generator 402 to input 422 of VCDL 408. Pulse generator 402 may generate pulses synchronized to the reference signal, which may be received by pulse generator 402 at input 426. When LOCK signal 246 is a logic "1" (i.e., output signal 244 of VCO 208 is locked to reference signal 240), AND gate 416 does not provide pulses generated by pulse generator 402 to input 422. Charge pump 404 receives at input 428 signal 250 indicating a phase difference between VCO output signal 244 and the reference signal. Based on signal 250, charge pump 404 adjusts control voltage ($V_{ctr}$) 430 provided to VCDL 408. Adjustments of control voltage 430 either increase or decrease the amount of delay introduced to the pulse generated by pulse generator 402, thereby adjusting when restart signal 254 is provided to VCO 208 and hence the phase of VCO output signal 244.

The components of timing circuit 220 shown in FIG. 4 are only illustrative. Any other circuitry operative to perform the functions of timing circuit described in connection with PLL circuit 200 (FIG. 2) may be provided. For example, in some embodiments of the present invention, VCDL 408 may be the same VCDL 218 used to generate the frequency lock of VCO 208. In particular, after locking of VCDL output signal 238 to the reference signal, a first multiplexer coupled to input 256 of VCDL 218 may cause VCDL 218 to receive the signal output by AND gate 416, and to discontinue receiving the reference clock signal. A second multiplexer may cause VCDL 218 to receive control voltage 430 and to discontinue receiving control voltage 248. As another example, charge pump 404, loop filter 406 and VCDL 408 may be replaced with digital circuitry (e.g., a digital delay line) operative to provide an appropriate delay for the clock pulse generated by pulse generator 402.

Various other functions of timing circuit 220 may be performed using suitable analog or digital components (e.g., one or more logic gates comprised of one or more CMOS transistors). For example, timing circuit 220 may include a switch operative to output, in response to receiving signal 246 indicating that VCDL output signal 238 is locked to the reference signal, one or both of signal 252 for preventing charge pump circuit 204 from adjusting control voltage 248 and signal 258 for preventing VCDL output 238 from being received by phase/frequency detecting circuit 202. The design of a suitable timing circuit 220 should be apparent to one of ordinary skill in the art in view of the foregoing description and therefore will not be further described.

PLL circuits of the present invention may be used for any suitable PLL application. For example, PLL circuit 200 may provide a single output signal (e.g., output signal 244) locked to both the phase and frequency of the reference signal. As another example, PLL circuit 200 may be used as a multi-phase clock generator, where VCDs 210, 212, 214 and 216 provide a corresponding plurality of output signals phase shifted relative to the reference clock signal by 90°, 180°, 270° and 360°, respectively. Still another example, PLL circuit 200 may be used as a frequency multiplier for outputting one or more signals having a higher frequency than the reference clock signal. In PLL frequency multiplying applications, VCO output 244 may be input to a frequency divider and the output of the frequency divider may be coupled to input 242 of phase/frequency detecting circuit 202.

Figure 5:
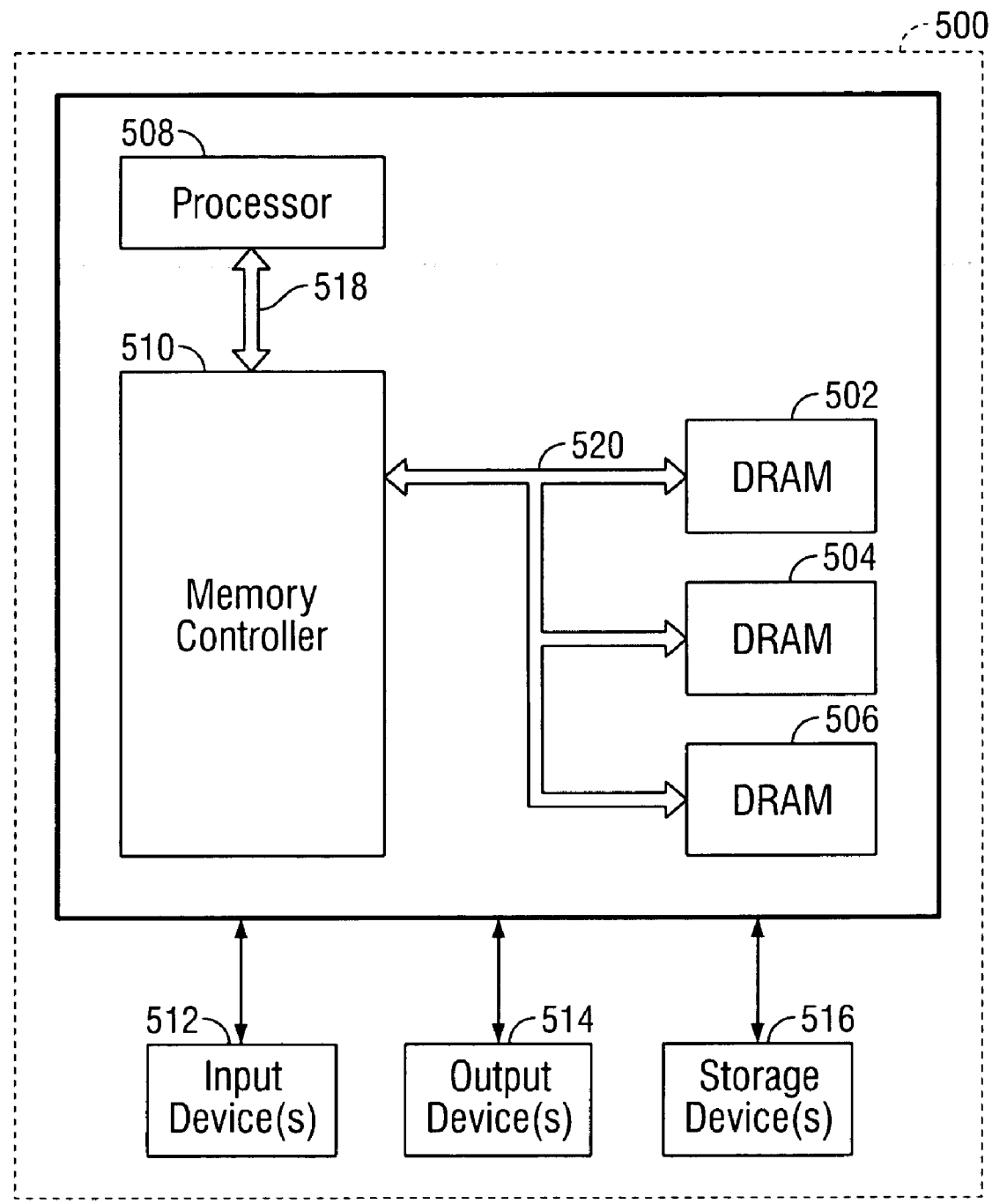
FIG. 5 is a block diagram of a system that incorporates the phase-locked loop circuit of the present invention.

FIG. 5 shows a system that incorporates the invention. System 500 includes a plurality of DRAM chips 502, 504 and 506 comprising memory cells, a processor 508, a memory controller 510, input devices 512, output devices 514, and optional storage devices 516. Data and control signals are transferred between processor 508 and memory controller 510 via bus 518. Similarly, data and control signals are transferred between memory controller 510 and DRAM chips 502, 504 and 506 via bus 520. One or more DRAM chips 502, 504 and 506 include a PLL circuit in accordance with the invention (e.g., PLL circuit 200 (FIG. 2)). For example, one or more of the DRAM chips may include such a PLL circuit to synchronize DRAM read, write and refresh operations with a reference signal received from memory controller 510. Input devices 512 can include, for example, a keyboard, a mouse, a touch-pad display screen, or any other appropriate device that allows a user to enter information into system 500. Output devices 514 can include, for example, a video display unit, a printer, or any other appropriate device capable of providing output data to a user. Input devices 512 and output devices 514 can alternatively be a single input/output device. Storage devices 516 can include, for example, one or more disk or tape drives. System 500 is only exemplary. The invention is applicable to any other suitable systems and integrated circuits that have PLL circuits.

Thus it is seen that circuits and methods for reducing lock time of PLL circuits are provided. One skilled in the art will appreciate that the invention can be practiced by other than the described embodiments, which are presented for purposes of illustration and not of limitation, and the present invention is limited only by the claims which follow.

We claim:

1. A method of locking a voltage-controlled oscillator to a reference signal, said method comprising:

generating an output signal by said voltage-controlled oscillator;

locking said output signal to a frequency of said reference signal;

locking said output signal to a phase of said reference signal; and maintaining said output signal locked to said frequency during said locking said output signal to said phase.

2. The method of claim 1 wherein said locking said output signal to said frequency comprises providing a control voltage of a voltage-controlled delay line to said voltage-controlled oscillator, wherein said voltage-controlled oscillator and said voltage-controlled delay line have substantially identical voltage-controlled delay units.

3. The method of claim 1 wherein locking said output signal to said frequency comprises receiving said reference signal by a phase/frequency detector.

4. The method of claim 1 wherein locking said output signal to said frequency comprises receiving said reference signal by a phase detector.

5. The method of claim 1 wherein said locking said output signal to said phase comprises:

measuring a phase difference between said reference signal and said output signal; and restarting oscillation of said voltage-controlled oscillator based on said phase difference.

6. The method of claim 1 wherein said maintaining said output signal locked to said frequency comprises preventing a control voltage received by said voltage-controlled oscillator from being adjusted during said locking said output signal to said phase.

7. A method of locking a voltage-controlled oscillator to a reference signal, said method comprising:

generating a control voltage;

providing said control voltage to at least one voltage-controlled delay unit of a voltage-controlled delay line, wherein said control voltage causes said voltage-controlled delay line to lock to said reference signal;

providing said control voltage to at least one voltage-controlled delay unit of said voltage-controlled oscillator, wherein said at least one voltage-controlled delay unit of said voltage-controlled oscillator is substantially identical to said at least one voltage-controlled delay unit of said voltage-controlled delay line and wherein said control voltage causes an output signal generated by said voltage-controlled oscillator to lock to a frequency of said reference signal; and holding substantially constant said control voltage provided to said at least one voltage-controlled delay unit of said voltage-controlled oscillator during locking of said output signal to a phase of said reference signal.

8. The method of claim 7 wherein generating said control voltage comprises:
   receiving an output of said voltage-controlled delay line; and
   comparing said output to said reference signal.

9. A method of locking an output signal generated by a voltage-controlled oscillator to a reference signal, said method comprising:
   receiving a signal indicating that a voltage-controlled delay line is locked to said reference signal, wherein a control voltage of said voltage-controlled delay line is provided to said voltage-controlled oscillator and wherein said voltage-controlled oscillator and said voltage-controlled delay line have substantially identical voltage-controlled delay units;
   in response to receiving said signal indicating that said voltage-controlled delay line is locked, preventing said control voltage provided to said voltage-controlled oscillator from being adjusted;
   receiving a signal indicating a phase difference between said reference signal and said output signal; and
   restarting oscillation of said voltage-controlled oscillator based on said signal indicating said phase difference.

10. A phase-locked loop circuit comprising:
   a voltage-controlled oscillator comprising at least one voltage-controlled delay unit;
   a voltage-controlled delay line comprising at least one voltage-controlled delay unit that is substantially identical to said at least one voltage-controlled delay unit of said voltage-controlled oscillator;
   phase detecting circuitry operative to receive a signal output by said voltage-controlled oscillator, a signal output by said voltage-controlled delay line and a reference signal, and to output a first signal indicating a phase difference between said reference signal and said signal output by said voltage-controlled delay line and a second signal indicating a phase difference between said reference signal and said signal output by said voltage-controlled oscillator;
   charge pump circuitry operative to generate, in response to receiving said first signal, a control voltage that causes said signal output by said voltage-controlled delay line to lock to said reference signal, wherein said voltage-controlled oscillator is operative to receive said control voltage; and
   a timing circuit operative to restart oscillation of said voltage-controlled oscillator based on said second signal and to prevent said charge pump circuitry from adjusting said control voltage received by said voltage-controlled oscillator.

11. The circuit of claim 10 wherein said phase detecting circuitry comprises a phase/frequency detector operative to receive said signal output by said voltage-controlled oscillator, said signal output by said voltage-controlled delay line and said reference signal.

12. The circuit of claim 10 wherein said phase detecting circuitry comprises:
   a phase detector operative to receive said reference signal and said signal output by said voltage-controlled delay line and to generate said first signal; and
   a phase/frequency detector operative to receive said reference signal and said signal output by said voltage-controlled oscillator and to generate said first signal.

13. The circuit of claim 10 wherein said timing circuit is operative to prevent said charge pump circuitry from adjusting said control voltage in response to receiving a signal indicating that said voltage-controlled delay line is locked to said reference signal.

14. The circuit of claim 10 wherein only one of said signal output by said voltage controlled oscillator and said signal output by said voltage-controlled delay line is received by said phase detecting circuitry at a time.

15. The circuit of claim 10 wherein said timing circuit is operative to select which of said signal output by said voltage-controlled oscillator and said signal output by said voltage-controlled delay line is received by said phase detecting circuitry.

16. The circuit of claim 10 wherein said timing circuit is operative to prevent said voltage-controlled oscillator from outputting said signal output by said voltage-controlled oscillator.

17. The circuit of claim 10 wherein said timing circuit is operative to prevent said voltage-controlled delay line from outputting said signal output by said voltage-controlled delay line.

18. The circuit of claim 17 wherein said timing circuit prevents said voltage-controlled delay line from outputting said signal in response to receiving a signal indicating that said voltage-controlled delay line is locked to said reference signal.

19. A phase-locked loop circuit comprising:
   a voltage-controlled oscillator comprising at least one voltage-controlled delay unit;
   a voltage-controlled delay line comprising at least one voltage-controlled delay unit that is substantially identical to said at least one voltage-controlled delay unit of said voltage-controlled oscillator;
   first phase detecting circuitry operative to receive a signal output by said voltage-controlled delay line and a reference signal, and to output a first signal indicating a phase difference between said reference signal and said signal output by said voltage-controlled delay line;
   second phase detecting circuitry operative to receive a signal output by said voltage-controlled oscillator and said reference signal, and to output a second signal indicating a phase difference between said reference signal and said signal output by said voltage-controlled oscillator;
   charge pump circuitry operative to generate, in response to receiving said first signal, a control voltage that causes said signal output by said voltage-controlled delay line to lock to said reference signal, wherein said voltage-controlled oscillator is operative to receive said control voltage;
   a switch operative to prevent, in response to receiving a signal indicating said signal output by said voltage-controlled delay line is locked to said reference signal, said charge pump circuitry from adjusting said control voltage received by said voltage-controlled oscillator;
   a pulse generator operative to generate a pulse based on said reference signal; and
   a delay line operative to delay said pulse by an amount of delay determined based on said second signal, wherein an output of said delay line is provided to said voltage-controlled oscillator and wherein said output causes oscillation of said voltage-controlled oscillator to restart.

20. A computer system comprising:
   a processor;
   a memory controller coupled to said processor; and a plurality of dynamic random access memory (DRAM) chips coupled to said memory controller, at least one of said DRAM chips comprising a phase-locked loop circuit comprising:
- a voltage-controlled oscillator operative to generate an output signal;
- circuitry operative to lock said output signal to a frequency of a reference signal;
- circuitry operative to lock said output signal to a phase of said reference signal; and
- circuitry operative to maintain said output signal locked to said frequency while said output signal to is locked to said phase.

21. A memory comprising:
at least one memory cell; and
a clock synchronization circuit comprising:
- a voltage-controlled oscillator operative to generate an output signal;
- circuitry operative to lock said output signal to a frequency of a reference signal;
- circuitry operative to lock said output signal to a phase of said reference signal; and
- circuitry operative to maintain said output signal locked to said frequency while said output signal to is locked to said phase, wherein at least one of a read, write and refresh operation of said at least one memory cell is performed based on said output signal.

22. A phase-locked loop circuit comprising:
- a voltage-controlled oscillator for generating an output signal;
- means for locking said output signal to a frequency of said reference signal;
- means for locking said output signal to a phase of said reference signal; and
- means for maintaining said output signal locked to said frequency during said locking said output signal to said phase.

* * * * *